US011183976B2

(12) United States Patent
Brantley et al.

(10) Patent No.: US 11,183,976 B2
(45) Date of Patent: Nov. 23, 2021

(54) HIGH VOLTAGE OUTPUT STAGE

(71) Applicant: TEXAS INSTRUMENTS INCORPORATED, Dallas, TX (US)

(72) Inventors: Steven Graham Brantley, Satellite Beach, FL (US); Munaf Hussain Shaik, Tucson, AZ (US); Bhuvanesh Radhakrishnan Kulasekaran, Kumbakonam (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/708,660

(22) Filed: Dec. 10, 2019

(65) Prior Publication Data
US 2021/0175859 A1 Jun. 10, 2021

(51) Int. Cl.
*H03F 1/22* (2006.01)
*H03F 1/34* (2006.01)
*H03F 3/213* (2006.01)

(52) U.S. Cl.
CPC ............. *H03F 1/342* (2013.01); *H03F 3/213* (2013.01); *H03F 2200/129* (2013.01); *H03F 2200/267* (2013.01)

(58) Field of Classification Search
CPC ........................................................ H03F 1/22
USPC ................................................ 330/311, 310
See application file for complete search history.

(56) References Cited

U.S. PATENT DOCUMENTS

| 2003/0184388 | A1* | 10/2003 | Wilson | H03F 3/082 330/308 |
| 2005/0007200 | A1* | 1/2005 | Inoue | H03F 1/223 330/311 |
| 2007/0285175 | A1* | 12/2007 | Oh | H03F 3/72 330/311 |
| 2009/0179706 | A1* | 7/2009 | Wong | H03F 1/223 330/311 |

* cited by examiner

*Primary Examiner* — Henry Choe
(74) *Attorney, Agent, or Firm* — John R. Pessetto; Charles A. Brill; Frank D. Cimino

(57) ABSTRACT

An amplifier circuit includes a high-voltage output stage. The high-voltage output stage includes an output terminal, a high-side output circuit, a low-side output circuit, and a feedback circuit. The high-side output circuit sources current to the output terminal, and includes a high-side input transistor, a first high-side cascode transistor coupled to the high-side input transistor, and a second high-side cascode transistor coupled to the first high-side cascode transistor and the output terminal. The low-side output circuit sinks current from the output terminal, and includes a low-side input transistor, a first low-side cascode transistor coupled to the low-side input transistor, and a second low-side cascode transistor coupled to the first low-side cascode transistor and the output terminal. The feedback circuit is configured to bias the second high-side cascode transistor and the second low-side cascode transistor based on a sense voltage generated by the high-side output circuit or the low-side output circuit.

19 Claims, 6 Drawing Sheets

HIGH VOLTAGE OUTPUT STAGE

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc. In application where large signal dynamic range is desirable, operational amplifiers that include a high-voltage output stage are used.

SUMMARY

A high-voltage output stage that includes adaptive cascode biasing is disclosed herein. In one example, an amplifier circuit includes a high-voltage output stage. The high-voltage output stage includes an output terminal, a high-side input transistor, a first high-side cascode transistor, a second high-side cascode transistor, and a resistor. The high-side input transistor includes a first terminal coupled to a power supply rail, and a second terminal coupled to a signal source. The first high-side cascode transistor includes a first terminal coupled to a third terminal of the high-side input transistor, and a second terminal coupled to a voltage source. The second high-side cascode transistor includes a first terminal coupled to a third terminal of the first high-side cascode transistor, and a second terminal coupled to the output terminal. The resistor includes a first terminal coupled to the output terminal, and a second terminal coupled to a third terminal of the second high-side cascode transistor.

In another example, an amplifier circuit includes a high-voltage output stage. The high-voltage output stage includes an output terminal, a high-side input transistor, a first high-side cascode transistor, a second high-side cascode transistor, a high-side sense transistor, a first voltage source, and a second voltage source. The high-side input transistor includes a first terminal coupled to a power supply rail, and a second terminal coupled to a signal source. The first high-side cascode transistor includes a first terminal coupled to a third terminal of the high-side input transistor, and a second terminal coupled to the first voltage source. The second high-side cascode transistor includes a first terminal coupled to a third terminal of the first high-side cascode transistor, and a second terminal coupled to the output terminal. The high-side sense transistor includes a first terminal coupled to the first terminal of the second high-side cascode transistor, and a second terminal coupled to the power supply rail. The second voltage source includes a first terminal coupled to a third terminal of the high-side sense transistor, and a second terminal coupled to a third terminal of the second high-side cascode transistor.

In a further example, an amplifier circuit includes a high-voltage output stage. The high-voltage output stage includes an output terminal, a high-side output circuit, a low-side output circuit, and a feedback circuit. The high-side output circuit is configured to source current to the output terminal, and includes a high-side input transistor, a first high-side cascode transistor coupled to the high-side input transistor, and a second high-side cascode transistor coupled to the first high-side cascode transistor and the output terminal. The low-side output circuit is configured to sink current from the output terminal, and includes a low-side input transistor, a first low-side cascode transistor coupled to the low-side input transistor, and a second low-side cascode transistor coupled to the first low-side cascode transistor and the output terminal. The feedback circuit is configured to bias the second high-side cascode transistor and the second low-side cascode transistor based on a sense voltage generated by the high-side output circuit or the low-side output circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

A high voltage output stage may be implemented in various ways. In one example, a high-voltage output stage is implemented using high voltage compatible transistors (Drain-Extended metal oxide semiconductor field effect transistors (MOSFETs) (DEMOS) or Laterally Diffused MOSFETs (LDMOS)) directly as the gain devices in the output stage. This approach is usually sub-optimal in analog output stages since high-voltage MOSFETs are optimized for ON mode resistance and not for signal chain parameters such as trans-conductance and output impedance.

Some high-voltage output stage implementations avoid use of high-voltage MOSFETs in the analog signal chain by using a low-voltage device optimized for transconductance, output resistance, etc. as a gain device. Such implementations risk exposure to catastrophically high voltages which may damage or compromise the reliability of the low-voltage device. High-voltage cascode transistors are used to cascode the low-voltage device for high voltage protection. Multiple cascode transistors are used when the supply voltages are higher than the voltage rating of the high-voltage cascode transistors. Biasing multiple cascode transistors is challenging because the power (output voltage*output current) delivered to the load is dissipated by the cascode transistors since the low-voltage devices have a lower terminal voltage.

Figure 1:
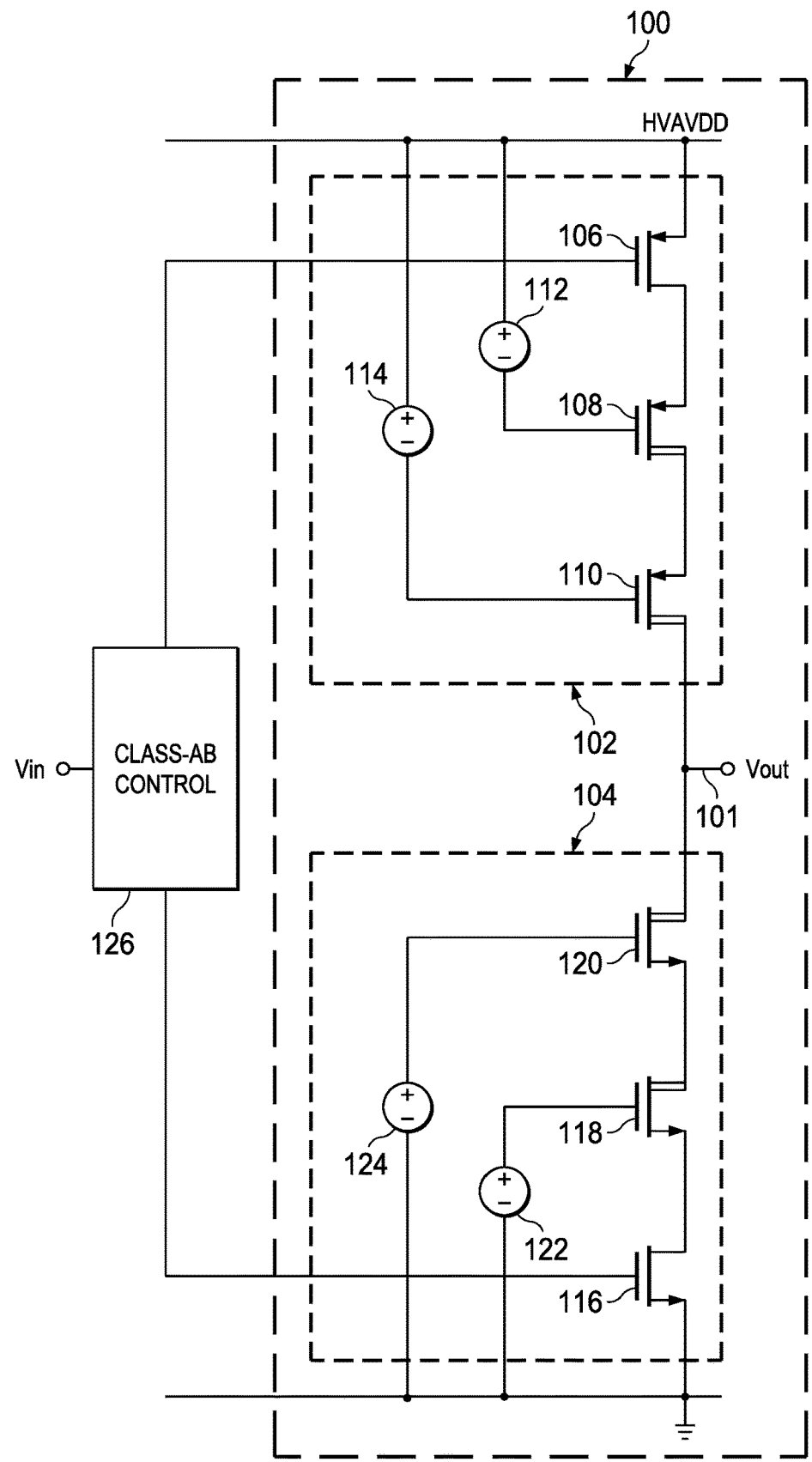
FIG. 1 shows a schematic level diagram for a high-voltage output stage that includes constant voltage biasing of the cascode transistors.

FIG. 1 shows a schematic level diagram for a high-voltage output stage 100 that includes constant voltage biasing of the cascode transistors. The high-voltage output stage 100 includes an output terminal 101, a high-side output circuit 102, and a low-side output circuit 104. The high-side output circuit 102 includes an input transistor 106, a cascode transistor 108, a cascode transistor 110, a voltage source 112, and a voltage source 114. The input transistor 106 is coupled to a class AB control circuit 126, or other signal source, for receipt of a signal to be output by the high-voltage output stage 100. The cascode transistor 108 is coupled to the input transistor 106. The cascode transistor 110 is coupled to the cascode transistor 108 and the output terminal 101. The voltage source 112 generates a constant bias voltage for the cascode transistor 108, and the voltage source 114 generates a constant bias voltage for the cascode transistor 110.

The low-side output circuit 104 includes an input transistor 116, a cascode transistor 118, a cascode transistor 120, a voltage source 122, and a voltage source 124. The input transistor 116 is coupled to the class AB control circuit 126, or other signal source, for receipt of a signal to be output by the high-voltage output stage 100. The cascode transistor 118 is coupled to the input transistor 116. The cascode transistor 120 is coupled to the cascode transistor 118 and the output terminal 101. The voltage source 122 generates a constant bias voltage for the cascode transistor 118, and the voltage source 124 generates a constant bias voltage for the cascode transistor 120.

Because the bias voltages applied to the cascode transistor 108, the cascode transistor 110, the cascode transistor 118, and the cascode transistor 120 are constant, as the voltage the output terminal 101 changes the voltages dropped across the cascode transistors cascode transistor 108 and cascode transistor 110 (or the cascode transistors 118 and 120) may be unequal, and if the voltage across one of the cascode transistors exceeds a maximum value, then the cascode transistor may be damaged. Implementations of the high-voltage output stage described below adaptively bias the cascode transistors based on feedback from the high-side and/or low-side output circuits.

Figure 2:
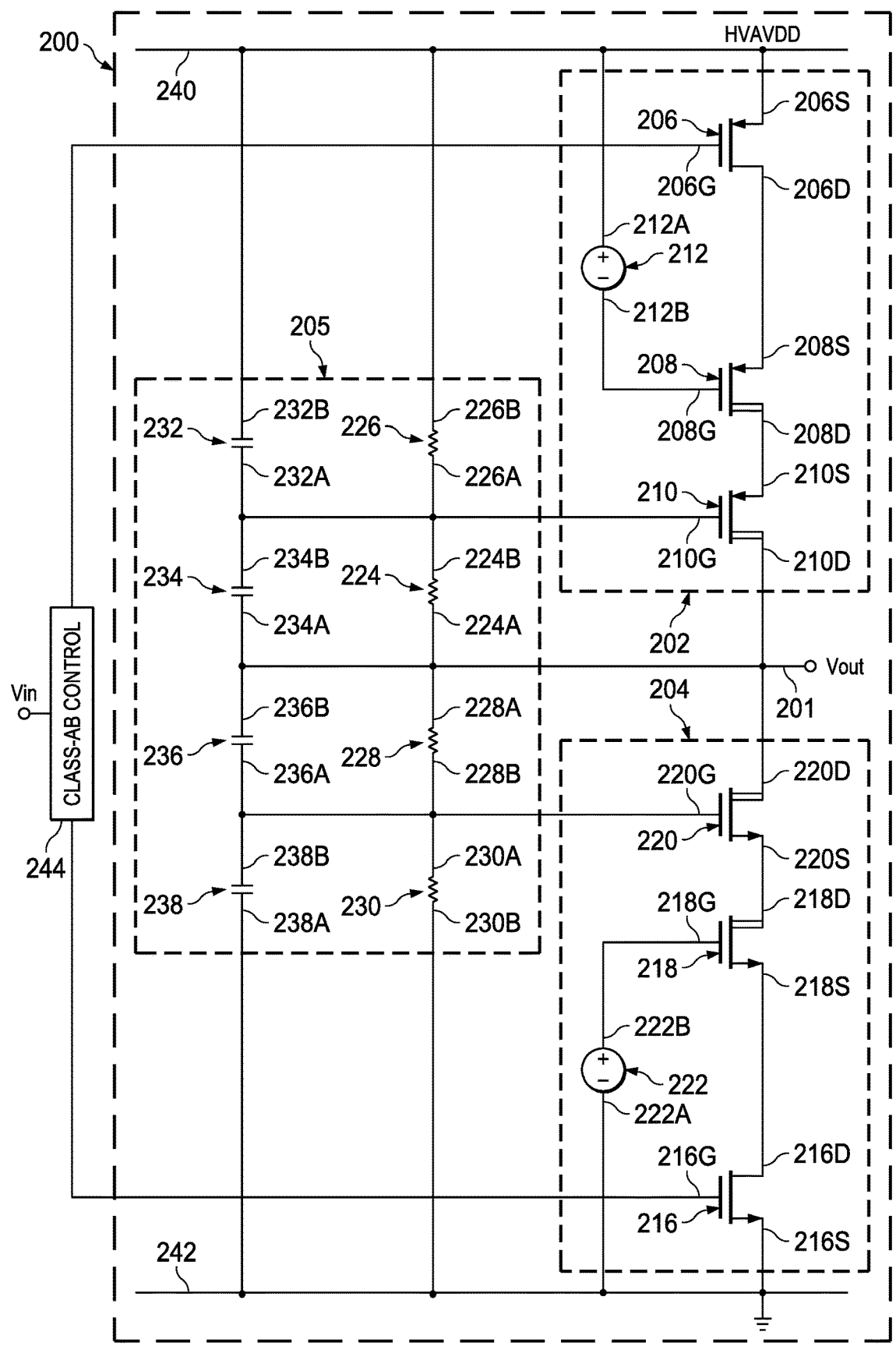
FIG. 2 shows a schematic level diagram for a high-voltage output stage that includes resistor dividers to bias the cascode transistors based on output voltage in accordance with this description.

FIG. 2 shows a schematic level diagram for a high-voltage output stage 200 that includes resistor dividers to bias the cascode transistors based on output voltage in accordance with this description. The high-voltage output stage 200 includes an output terminal 201, a high-side output circuit 202, a low-side output circuit 204, and a feedback circuit 205. The high-side output circuit 202 includes an input transistor 206, a cascode transistor 208, a cascode transistor 210, and a constant voltage source 212. The input transistor 206 includes a gate terminal 206G that is coupled to a class AB control circuit 244, or other signal source, for receipt of a signal to be output by the high-voltage output stage 200. The source terminal 206S of the input transistor 206 is coupled to a power supply rail 240. The input transistor 206 is a low-voltage MOSFET is some implementations of the high-voltage output stage 200.

The source terminal 208S of the cascode transistor 208 is coupled to the drain terminal 206D of the input transistor 206. The constant voltage source 212 generates a constant bias voltage for biasing the cascode transistor 208. A terminal 212A of the constant voltage source 212 is coupled to the power supply rail 240, and a terminal 212B of the constant voltage source 212 is coupled to the gate terminal 208G of the cascode transistor 208.

The source terminal 210S of the cascode transistor 210 is coupled to the drain terminal 208D of the cascode transistor 208. The drain terminal 210D of the cascode transistor 210 is coupled to the output terminal 201.

The low-side output circuit 204 includes an input transistor 216, a cascode transistor 218, a cascode transistor 220, and a constant voltage source 222. The input transistor 216 includes a gate terminal 216G that is coupled to the class AB control circuit 244, or other signal source, for receipt of a signal to be output by the high-voltage output stage 200. The source terminal 216S of the input transistor 216 is coupled to a ground rail 242. The input transistor 216 is a low-voltage MOSFET is some implementations of the high-voltage output stage 200.

The source terminal 218S of the cascode transistor 218 is coupled to the drain terminal 216D of the input transistor 216. The constant voltage source 222 generates a constant bias voltage for biasing the cascode transistor 218. A terminal 222A of the constant voltage source 222 is coupled to the ground rail 242, and a terminal 222B of the constant voltage source 222 is coupled to the gate terminal 218G of the cascode transistor 218.

The source terminal 220S of the cascode transistor 220 is coupled to the drain terminal 218D of the cascode transistor 218. The drain terminal 220D of the cascode transistor 220 is coupled to the output terminal 201.

The feedback circuit 205 biases the cascode transistor 210 and the cascode transistor 220 based on the voltage at the output terminal 201. The feedback circuit 205 includes a resistor 224, a resistor 226, a resistor 228, a resistor 230, a capacitor 232, a capacitor 234, a capacitor 236, and a capacitor 238. The resistor 224 and the resistor 226 are coupled to form a first voltage divider that biases the cascode transistor 210. A terminal 224A of the resistor 224 is coupled to the output terminal 201, and a terminal 224B of the resistor 224 is coupled to the gate terminal 210G of the cascode transistor 210. A terminal 226A of the resistor 226 is coupled to the terminal 224B of the resistor 224, and a terminal 226B of the resistor 226 is coupled to the power supply rail 240. The capacitors 232 and 234 are connected in parallel with the resistors 226 and 224. The capacitor 232 includes a terminal 232B coupled to the power supply rail 240 and a terminal 232A coupled to the gate terminal 210G of the cascode transistor 210. The capacitor 234 includes a terminal 234B coupled to the terminal 232A of the capacitor 232 and a terminal 234A coupled to the terminal 224A of the resistor 224.

The resistor 228 and the resistor 230 are coupled to form a second voltage divider that biases the cascode transistor 220. A terminal 228A of the resistor 228 is coupled to the output terminal 201, and a terminal 228B of the resistor 228 is coupled to the gate terminal 220G of the cascode transistor 220. A terminal 230A of the resistor 230 is coupled to the terminal 228B of the resistor 228, and a terminal 230B of the resistor 230 is coupled to the ground rail 242. The capacitors 236 and 238 are connected in parallel with the resistors 228 and 230. The capacitor 238 includes a terminal 238A coupled to the ground rail 242 and a terminal 238B coupled to the gate terminal 220G of the cascode transistor 220. The capacitor 236 includes a terminal 236A coupled to the terminal 238B of the capacitor 238 and a terminal 236B coupled to the terminal 228A of the resistor 228.

Figure 3:
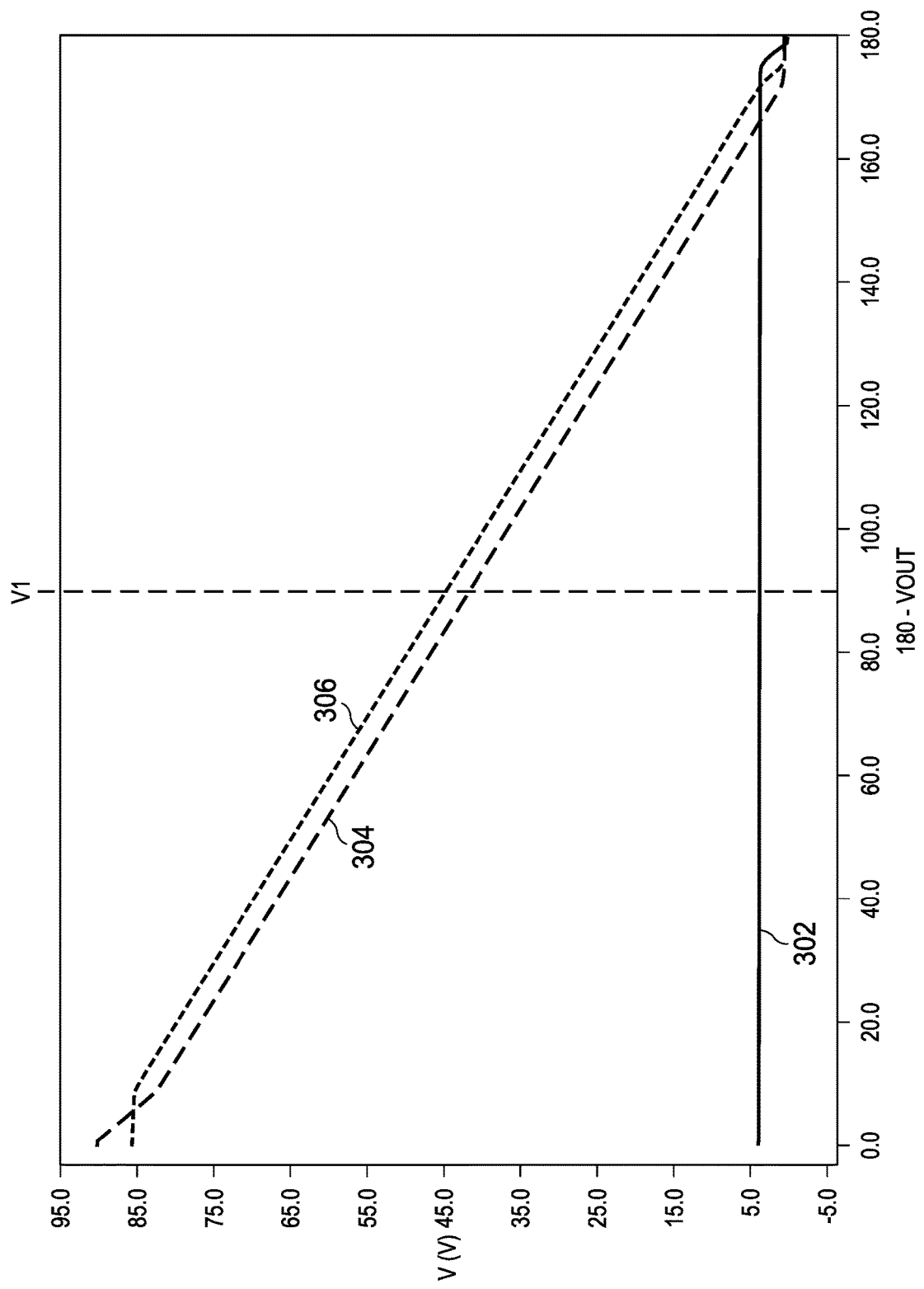
FIG. 3 shows a graph of voltage across the transistors of the high-voltage output stage of FIG. 2.

FIG. 3 shows a graph of voltage across the transistors of the low-side output circuit 204 of the high-voltage output stage 200. In FIG. 3 the voltage at the output terminal 201 ranges from 0 volts to 180 volts. The voltage 302 dropped across the input transistor 216 is generally constant (e.g., less the 5 volts) over the entire range, while the voltage 304 dropped across the cascode transistor 220 and the voltage 306 dropped across the cascode transistor 218 are relatively equally (e.g., within 5 volts) over the entire range. Voltage drop across the transistors of the high-side output circuit 202 exhibits a similar profile. Equalization of the voltage dropped across the cascode transistor 218 and the cascode transistor 220 allows for reduction of the drain-source maximum voltage specification of the cascode transistor 218 and the cascode transistor 220.

Figure 4:
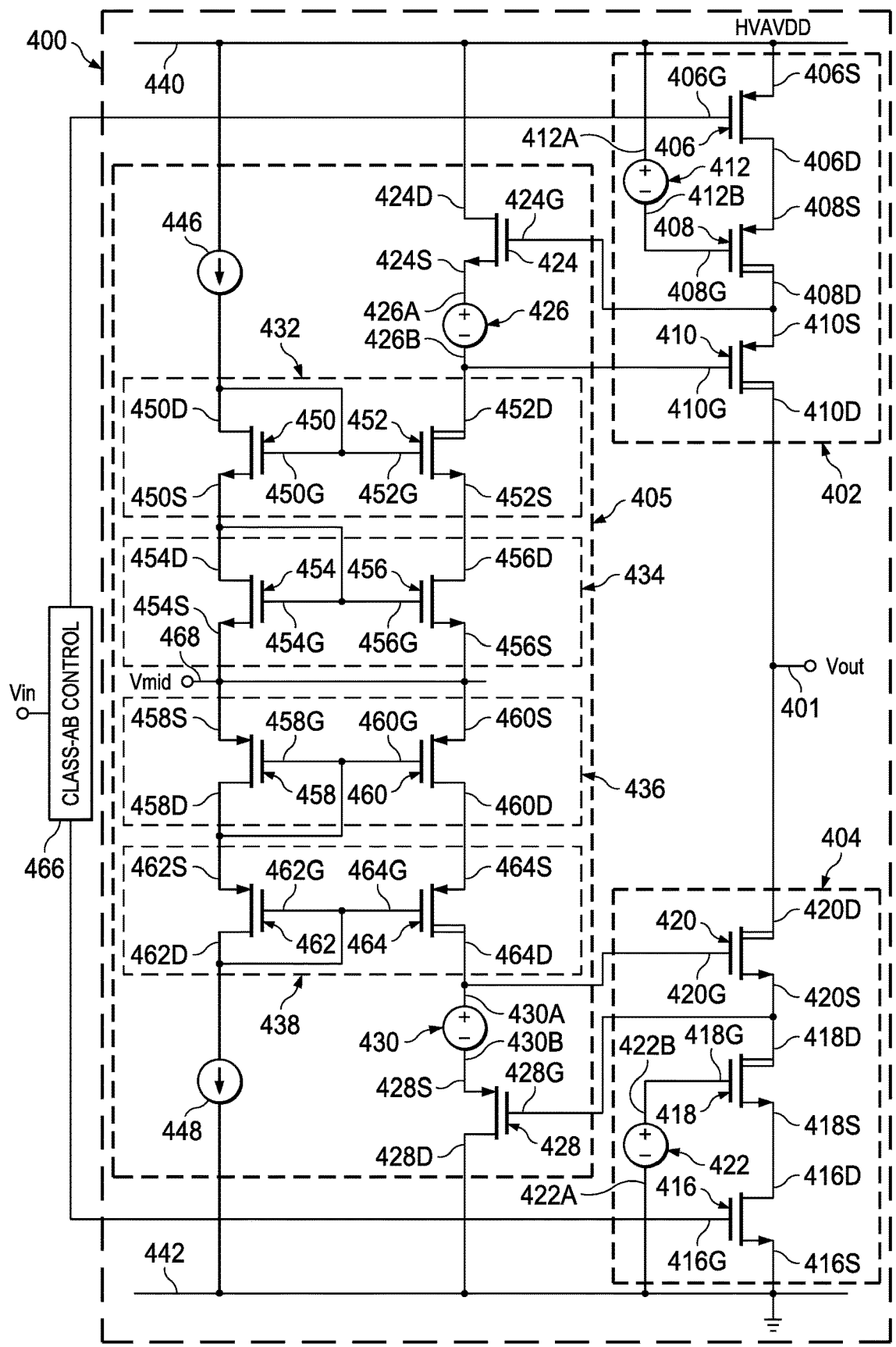
FIG. 4 shows a schematic level diagram for a high-voltage output stage that includes feedback circuitry to sequentially drop output voltage across the cascode transistors in accordance with this description.

FIG. 4 shows a schematic level diagram for a high-voltage output stage 400 that includes feedback circuitry to sequentially drop output voltage across the cascode transistors in accordance with this description. The high-voltage output stage 400 includes an output terminal 401, a high-side output circuit 402, a low-side output circuit 404, and feedback circuit 405. The high-side output circuit 402 includes an input transistor 406, a cascode transistor 408, a cascode transistor 410, and a constant voltage source 412. The input transistor 406 includes a gate terminal 406G that is coupled to a class AB control circuit 466, or other signal source, for receipt of a signal to be output by the high-voltage output stage 400. The source terminal 406S of the input transistor 406 is coupled to a power supply rail 440. The input transistor 406 is a low-voltage MOSFET used as a signal path device in is some implementations of the high-voltage output stage 400.

The source terminal 408S of the cascode transistor 408 is coupled to the drain terminal 406D of the input transistor 406. The constant voltage source 412 generates a constant bias voltage for biasing the cascode transistor 408. The terminal 412A of the constant voltage source 412 is coupled to the power supply rail 440, and the terminal 412B of the constant voltage source 412 is coupled to the gate terminal 408G of the cascode transistor 408. The constant bias voltage provided by the constant voltage source 412 ensures that the input transistor 406 has a drain-source voltage less than the rated maximum of the input transistor 406 and keeps the input transistor 406 in saturation under all operational conditions.

The source terminal 410S of the cascode transistor 410 is coupled to the drain terminal 408D of the cascode transistor 408. The drain terminal 410D of the cascode transistor 410 is coupled to the output terminal 401.

The low-side output circuit 404 includes an input transistor 416, a cascode transistor 418, a cascode transistor 420, and a constant voltage source 422. The input transistor 416 includes a gate terminal 416G that is coupled to the class AB control circuit 466, or other signal source, for receipt of a signal to be output by the high-voltage output stage 400. The source terminal 416S of the input transistor 416 is coupled to a ground rail 442. The input transistor 416 is a low-voltage MOSFET used as a signal path device is some implementations of the high-voltage output stage 400.

The source terminal 418S of the cascode transistor 418 is coupled to the drain terminal 416D of the input transistor 416. The constant voltage source 422 generates a constant bias voltage for biasing the cascode transistor 418. The terminal 422A of the constant voltage source 422 is coupled to the ground rail 442, and the terminal 422B of the constant voltage source 422 is coupled to the gate terminal 418G of the cascode transistor 418. The constant bias voltage provided by the constant voltage source 422 ensures that the input transistor 416 has a drain-source voltage less than the rated maximum of the input transistor 416 and keeps the input transistor 416 in saturation under all operational conditions.

The source terminal 420S of the cascode transistor 420 is coupled to the drain terminal 418D of the cascode transistor 418. The drain terminal 420D of the cascode transistor 420 is coupled to the output terminal 401.

The feedback circuit 405 biases the cascode transistor 410 based on the voltage at the source terminal 410S of the cascode transistor 410, and biases the cascode transistor 420 based on the voltage at the source terminal 420S of the cascode transistor 420 such that output voltage is sequentially dropped across the cascode transistors. The feedback circuit 405 includes a sense transistor 424, a constant voltage source 426, a sense transistor 428, a constant voltage source 430, a current mirror circuit 432, a current mirror circuit 434, a current mirror circuit 436, a current mirror circuit 438, a current source 446, and a current source 448. The sense transistor 424 senses the voltage at the source terminal 410S of the cascode transistor 410 and controls the bias voltage applied at the gate terminal 410G of the cascode transistor 410. The gate terminal 424G of the sense transistor 424 is coupled to the source terminal 410S of the cascode transistor 410. The drain terminal 424D of the sense transistor 424 is coupled to the power supply rail 440, and the source terminal 424S of the sense transistor 424 is coupled to a first terminal 426A of the constant voltage source 426. A second terminal 426B of the constant voltage source 426 is coupled to the gate terminal 410G of the cascode transistor 410.

The constant voltage source 426 is coupled to a midvoltage source via the current mirror circuit 432 and the current mirror circuit 434. The mid-voltage source generates a voltage that is one-half the difference of the voltage on the power supply rail 440 and the voltage on the ground rail 442. The current mirror circuit 432 includes a diode-connected transistor 450 and a mirror transistor 452. The diode-connected transistor 450 includes a drain terminal 450D coupled to a gate terminal 450G and the current source 446. The mirror transistor 452 includes a drain terminal 452D coupled to the terminal 426B of the constant voltage source 426, a gate terminal 452G coupled to the gate terminal 450G of the diode-connected transistor 450. The current mirror circuit 434 includes a diode-connected transistor 454 and a mirror transistor 456. The diode-connected transistor 454 includes a drain terminal 454D coupled to a gate terminal 454G of the diode-connected transistor 454 and a source terminal 450S of the diode-connected transistor 450, and includes a source terminal 454S coupled to the mid-voltage source. The mirror transistor 456 includes a drain terminal 456D coupled to the source terminal 452S of the mirror transistor 452, a gate terminal 456G coupled to the gate terminal 454G of the diode-connected transistor 454, and a source terminal 456S coupled to the mid-voltage source.

The sense transistor 428 senses the voltage at the source terminal 420S of the cascode transistor 420 and controls the bias voltage applied at the gate terminal 420G of the cascode transistor 420. The gate terminal 428G of the sense transistor 428 is coupled to the source terminal 420S of the cascode transistor 420. The drain terminal 428D of the sense transistor 428 is coupled to the ground rail 442, and the source terminal 428S of the sense transistor 428 is coupled to a first terminal 430B of the constant voltage source 430. A second terminal 430A of the constant voltage source 430 is coupled to the gate terminal 420G of the cascode transistor 420.

The sense transistor 428 is coupled to the mid-voltage source via the current mirror circuit 438 and the current mirror circuit 436. The current mirror circuit 438 includes a diode-connected transistor 462 and a mirror transistor 464. The diode-connected transistor 462 includes a drain terminal 462D coupled to a gate terminal 462G and the current source 448. The mirror transistor 464 includes a drain terminal 464D coupled to the terminal 430A of the constant voltage source 430, a gate terminal 464G coupled to the gate terminal 462G of the diode-connected transistor 462. The current mirror circuit 436 includes a diode-connected transistor 458 and a mirror transistor 460. The diode-connected transistor 458 includes a drain terminal 458D coupled to a gate terminal 458G of the diode-connected transistor 458 and a source terminal 462S of the diode-connected transistor 462, and includes a source terminal 458S coupled to the mid-voltage source. The mirror transistor 460 includes a drain terminal 460D coupled to the source terminal 464S of the mirror transistor 464, a gate terminal 460G coupled to the gate terminal 458G of the diode-connected transistor 458, and a source terminal 460S coupled to the mid-voltage source.

Figure 5:
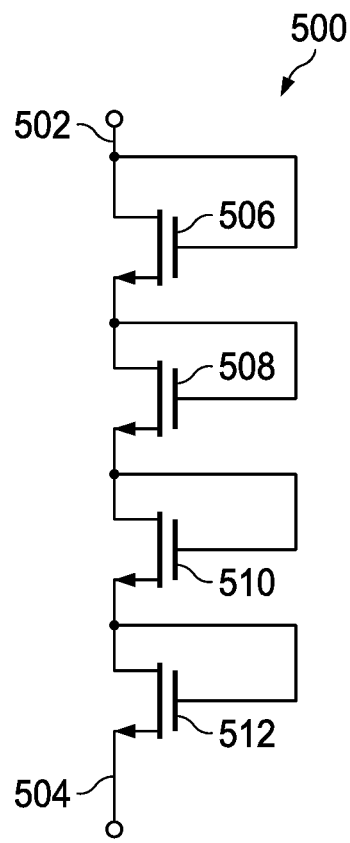
FIG. 5 shows a schematic level diagram for a voltage source suitable for use in the high-voltage output state of FIG. 4.

FIG. 5 shows a schematic level diagram for a voltage source 500 suitable for use in the high-voltage output stage 400. The voltage source 500 is an implementation of the constant voltage source 426 or the constant voltage source 430. The voltage source 500 includes a terminal 502, a terminal 504, and a number of diode-connected transistors connected in series between the terminal 502 and the terminal 504. While the transistors 506, 508, 510, and 512 are shown in FIG. 5, various implementations of the voltage source 500 may include any number of diode-connected transistors coupled in series.

Figure 6:
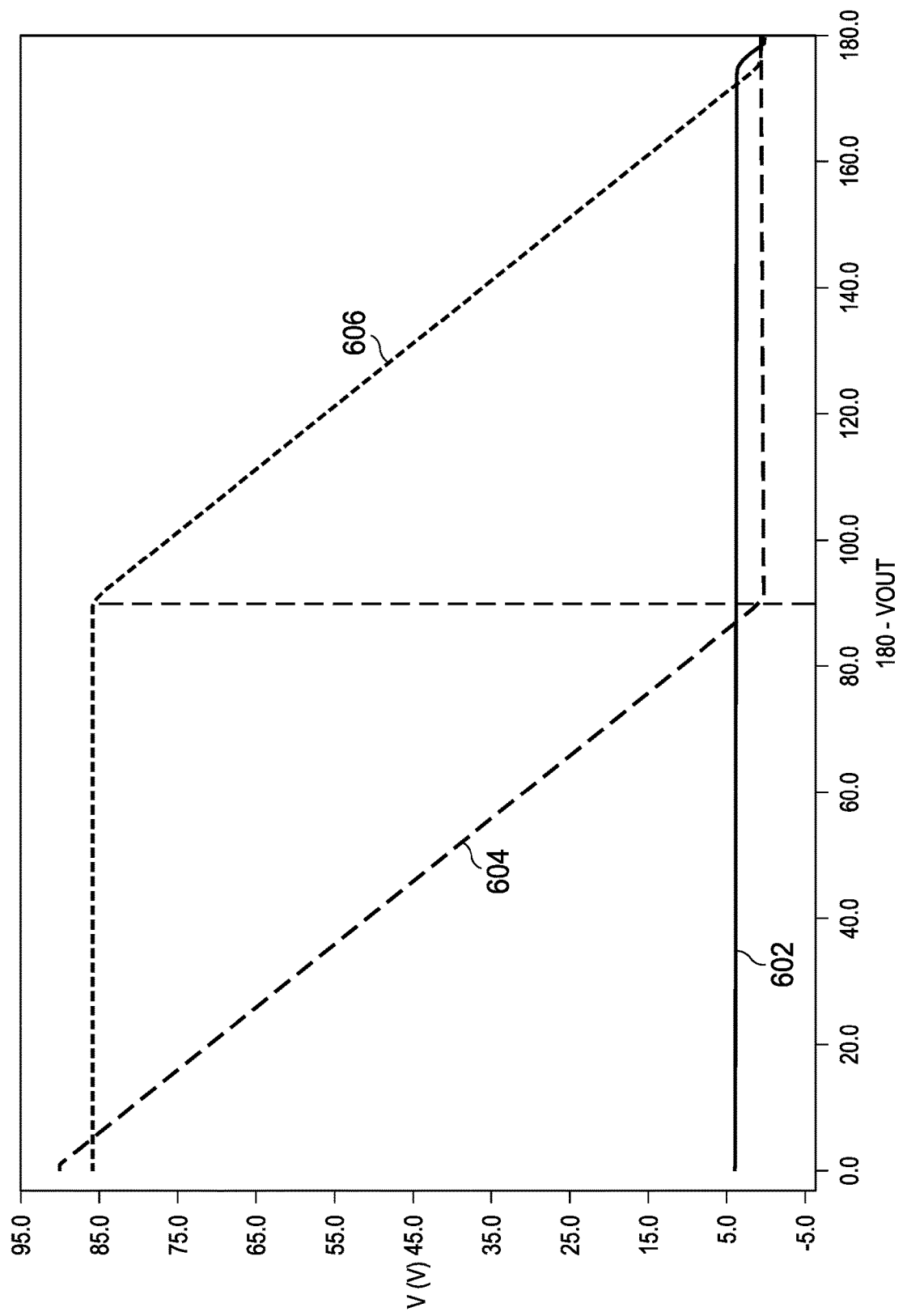
FIG. 6 shows a graph of voltage across the transistors of the high-voltage output stage of FIG. 4.

FIG. 6 shows a graph of voltage across the transistors of the low-side output circuit 404. Voltage across the transistors of the high-side output circuit 402 has a similar profile. In FIG. 6 the voltage at the output terminal 401 ranges from 0 volts to 180 volts. The voltage 602 dropped across the input transistor 416 is generally constant (e.g., less the 5 volts) over the entire range. When the voltage at the output terminal 401 (Vout) is less than the mid-voltage generated by the mid-voltage source (e.g., less than half the voltage at the power supply rail 440), the cascode transistor 420 behaves like a switch that is turned on. The sense transistor 428 senses the voltage at the drain terminal 418D of the cascode transistor 418 and biases the gate terminal 420G of the cascode transistor 420 to a sum of the voltage at the drain terminal 418D, the gate-source voltage of the sense transistor 428, and the voltage drop of the constant voltage source 430. The voltage across the constant voltage source 430 is generated by forcing a current onto diode-connected transistors as provided in the voltage source 500. The current source 448 is referenced to the mid-voltage, and therefore the current source 448 turns-off (loses compliance) when the voltage at the output terminal 401 and the voltage at the drain terminal 418D of the cascode transistor 418 are close to the mid-voltage. At this point, the voltage 606 across the cascode transistor 418 is approximately the mid-voltage. At the point where the current source 448 is turned-off (loses compliance), the cascode transistor 420 starts entering saturation operation and behaves like a cascode device rather than a switch.

When the voltage at the output terminal 401 is greater than the mid-voltage, the voltage 606 across the cascode transistor 418 is about half the voltage on the power supply rail 440. Any additional output voltage is dropped across the cascode transistor 420 since the voltage at the gate terminal 420G is constant at the mid-voltage, thereby forcing the cascode transistor 418 and the cascode transistor 420 to share VDS voltages at maximum output voltage of the high-voltage output stage 400.

In the range of about 0-90 volts shown in FIG. 6, the voltage 606 dropped across the cascode transistor 418 is constant (about 85 volts) and the voltage 604 dropped across the cascode transistor 420 decreases from about 90 volts to 0 volts. In a range of about 90-180 volts, the voltage 606 dropped across the cascode transistor 418 decreases from about 85 volts to 0 volts, and the voltage 604 dropped across the cascode transistor 420 remains constant at about 0 volts. Voltage drop across the transistors of the high-side output circuit 402 exhibits a similar profile. Thus, the high-voltage output stage 400 provides a voltage rating that is twice that of the cascode transistors 406, 408, 418, and 420.

Figure 7:
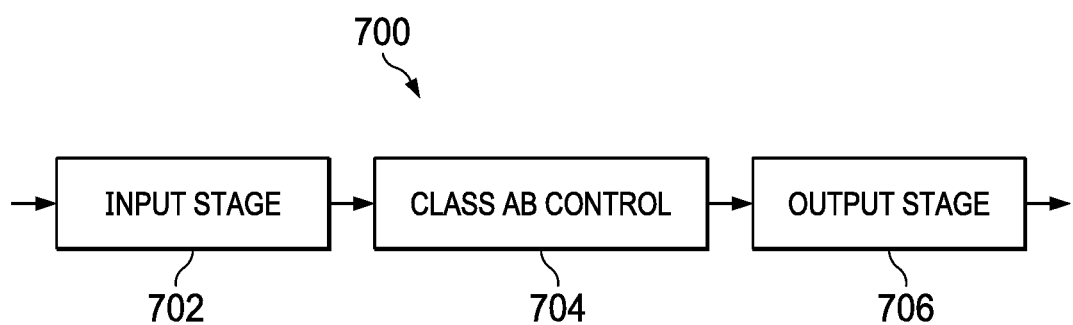
FIG. 7 shows a block diagram for an amplifier that includes a high-voltage output stage in accordance with the present description.

FIG. 7 shows a block diagram for an amplifier 700 that includes a high-voltage output stage in accordance with the present description. The amplifier 700 includes an input stage 702, a class AB control circuit 704, and an output stage 706. The output stage 706 is an implementation of the high-voltage output stage 200 or the high-voltage output stage 400.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An amplifier circuit, comprising:
   an output terminal;
   a high-side input transistor comprising:
      a first terminal coupled to a power supply terminal; and
      a second terminal coupled to a signal source;
   a first high-side cascode transistor comprising:
      a first terminal coupled to a third terminal of the high-side input transistor; and
      a second terminal coupled to a constant voltage source;
   a second high-side cascode transistor comprising:
      a first terminal coupled to a third terminal of the first high-side cascode transistor; and
      a second terminal coupled to the output terminal; and
   a resistor comprising:
      a first terminal coupled to the output terminal;
      a second terminal coupled to a third terminal of the second high-side cascode transistor; and
   a capacitor comprising:
      a first terminal coupled to the output terminal; and
      a second terminal coupled to the third terminal of the second high-side cascode transistor.

2. An amplifier circuit, comprising:
   an output terminal;
   a high-side input transistor comprising:
      a first terminal coupled to a power supply terminal; and
      a second terminal coupled to a signal source;
   a first high-side cascode transistor comprising:
      a first terminal coupled to a third terminal of the high-side input transistor; and
      a second terminal coupled to a constant voltage source;
   a second high-side cascode transistor comprising:
      a first terminal coupled to a third terminal of the first high-side cascode transistor; and
      a second terminal coupled to the output terminal; and
   a first resistor comprising:
      a first terminal coupled to the output terminal; and
      a second terminal coupled to a third terminal of the second high-side cascode transistor;
   a second resistor comprising:
      a first terminal coupled to the power supply terminal; and a second terminal coupled to the second terminal of the first resistor; and
a capacitor comprising:
a first terminal coupled to the power supply terminal; and
a second terminal coupled to the second terminal of the first resistor.
3. An amplifier circuit, comprising:
an output terminal;
a high-side input transistor comprising:
a first terminal coupled to a power supply terminal; and
a second terminal coupled to a signal source;
a first high-side cascode transistor comprising:
a first terminal coupled to a third terminal of the high-side input transistor; and
a second terminal coupled to a constant voltage source;
a second high-side cascode transistor comprising:
a first terminal coupled to a third terminal of the first high-side cascode transistor; and
a second terminal coupled to the output terminal; and
a resistor comprising:
a first terminal coupled to the output terminal; and
a second terminal coupled to a third terminal of the second high-side cascode transistor;
wherein:
the constant voltage source is a first constant voltage source;
the resistor is a first resistor; and
the amplifier circuit further comprises:
a low-side input transistor comprising:
a first terminal coupled to a ground; and
a second terminal coupled to the signal source;
a first low-side cascode transistor comprising:
a first terminal coupled to a third terminal of the low-side input transistor; and
a second terminal coupled to a second constant voltage source;
a second low-side cascode transistor comprising:
a first terminal coupled to a third terminal of the first low-side cascode transistor; and
a second terminal coupled to the output terminal; and
a second resistor comprising:
a first terminal coupled to the output terminal; and
a second terminal coupled to a third terminal of the second high-side cascode transistor.
4. The amplifier circuit of claim 3, further comprising:
a capacitor comprising:
a first terminal coupled to the output terminal; and
a second terminal coupled to the third terminal of the second low-side cascode transistor.
5. The amplifier circuit of claim 3, wherein the amplifier circuit comprises:
a third resistor comprising:
a first terminal coupled to the ground; and
a second terminal coupled to the second terminal of the second resistor; and
a second capacitor comprising:
a first terminal coupled to the ground; and
a second terminal coupled to the second terminal of the third resistor.
6. An amplifier circuit, comprising:
an output terminal;
a high-side input transistor comprising:
a first terminal coupled to a power supply terminal; and
a second terminal coupled to a signal source;
a first high-side cascode transistor comprising:
a first terminal coupled to a third terminal of the high-side input transistor; and
a second terminal coupled to a first constant voltage source;
a second high-side cascode transistor comprising:
a first terminal coupled to a third terminal of the first high-side cascode transistor; and
a second terminal coupled to the output terminal;
a high-side sense transistor comprising:
a first terminal coupled to the first terminal of the second high-side cascode transistor; and
a second terminal coupled to the power supply terminal; and
a second constant voltage source comprising:
a first terminal coupled to a third terminal of the high-side sense transistor; and
a second terminal coupled to a third terminal of the second high-side cascode transistor.
7. The amplifier circuit of claim 6, wherein the amplifier circuit further comprises a current mirror circuit comprising:
a first diode-connected transistor comprising:
a first terminal coupled to a current source; and
a second terminal coupled to the current source; and
a first mirror transistor comprising:
a first terminal coupled to the second terminal of the first diode-connected transistor; and
a second terminal coupled to the third terminal of the second high-side cascode transistor.
8. The amplifier circuit of claim 7, wherein:
the current mirror circuit is a first current mirror circuit; and
the amplifier circuit further comprises a second current mirror circuit comprising:
a second diode-connected transistor comprising:
a first terminal coupled to a third terminal of the first diode-connected transistor;
a second terminal coupled to the third terminal of the first diode-connected transistor; and
a third terminal coupled to a mid-voltage source; and
a second mirror transistor comprising:
a first terminal coupled to the second terminal of the second diode-connected transistor;
a second terminal coupled to a third terminal of the first mirror transistor; and
a third terminal coupled to the mid-voltage source.
9. The amplifier circuit of claim 6, wherein the amplifier circuit comprises:
a low-side input transistor comprising:
a first terminal coupled to a ground; and
a second terminal coupled to the signal source;
a first low-side cascode transistor comprising:
a first terminal coupled to a third terminal of the low-side input transistor; and
a second terminal coupled to a third constant voltage source;
a second low-side cascode transistor comprising:
a first terminal coupled to a third terminal of the first low-side cascode transistor; and
a second terminal coupled to the output terminal;
a low-side sense transistor comprising:
a first terminal coupled to the first terminal of the second low-side cascode transistor; and
a second terminal coupled to the ground; and
a fourth voltage source comprising:
a first terminal coupled to a third terminal of the low-side sense transistor; and
a second terminal coupled to a third terminal of the second low-side cascode transistor.
10. The amplifier circuit of claim 9, wherein the amplifier circuit further comprises a current mirror circuit comprising:
a first diode-connected transistor comprising:
a first terminal coupled to a current source; and
a second terminal coupled to the current source; and a first mirror transistor comprising:
　a first terminal coupled to the second terminal of the first diode-connected transistor; and
　a second terminal coupled to the third terminal of the second low-side cascode transistor.

11. The amplifier circuit of claim 10, wherein:
the current mirror circuit is a first current mirror circuit; and
the amplifier circuit further comprises a second current mirror circuit comprising:
　a second diode-connected transistor comprising:
　　a first terminal coupled to a third terminal of the first diode-connected transistor;
　　a second terminal coupled to the third terminal of the first diode-connected transistor; and
　　a third terminal coupled to a mid-voltage source; and
　a second mirror transistor comprising:
　　a first terminal coupled to the second terminal of the second diode-connected transistor;
　　a second terminal coupled to a third terminal of the first mirror transistor; and
　　a third terminal coupled to the mid-voltage source.

12. An amplifier circuit, comprising:
an output terminal;
a high-side output circuit configured to source current to the output terminal, and comprising:
　a high-side input transistor;
　a first high-side cascode transistor coupled to the high-side input transistor; and
　a second high-side cascode transistor coupled to the first high-side cascode transistor and the output terminal;
a low-side output circuit configured to sink current from the output terminal, and comprising:
　a low-side input transistor;
　a first low-side cascode transistor coupled to the low-side input transistor; and
　a second low-side cascode transistor coupled to the first low-side cascode transistor and the output terminal; and
a feedback circuit configured to bias the second high-side cascode transistor and the second low-side cascode transistor based on a sense voltage generated by the high-side output circuit or the low-side output circuit.

13. The amplifier circuit of claim 12, wherein the feedback circuit comprises:
a first resistor coupled to the output terminal and a gate terminal of the second high-side cascode transistor; and
a second resistor coupled to a power supply rail and the gate terminal of the second high-side cascode transistor.

14. The amplifier circuit of claim 12, wherein the feedback circuit comprises:
a first resistor coupled to the output terminal and a gate terminal of the second low-side cascode transistor; and
a second resistor coupled to a ground rail and the gate terminal of the second low-side cascode transistor.

15. The amplifier circuit of claim 12, wherein the feedback circuit comprises:
a sense transistor comprising a gate terminal coupled to a source terminal of the second high-side cascode transistor; and
a constant voltage source comprising:
　a first terminal coupled to a source terminal of the sense transistor; and
　a second terminal coupled to a gate terminal of the second high-side cascode transistor.

16. The amplifier circuit of claim 15, wherein the feedback circuit comprises:
a first current mirror circuit coupled to the gate terminal of the second high-side cascode transistor; and
a second current mirror circuit coupled to the first current mirror circuit and a mid-voltage source.

17. The amplifier circuit of claim 12, wherein the feedback circuit comprises:
a sense transistor comprising a gate terminal coupled to a source terminal of the second low-side cascode transistor; and
a voltage source comprising:
　a first terminal coupled to a source terminal of the sense transistor; and
　a second terminal coupled to a gate terminal of the second low-side cascode transistor.

18. The amplifier circuit of claim 17, wherein the feedback circuit comprises:
a first current mirror circuit coupled to the gate terminal of the second low-side cascode transistor; and
a second current mirror circuit coupled to the first current mirror circuit and a mid-voltage source.

19. The amplifier circuit of claim 12, further comprising:
a first voltage source coupled to a gate terminal of first high-side cascode transistor; and
a second voltage source coupled to a gate terminal of the first low-side cascode transistor.

\* \* \* \* \*